United States Patent [19]
Kimura et al.

[11] Patent Number: 5,833,939
[45] Date of Patent: Nov. 10, 1998

[54] BA($B_{1-x}M_x$)$_2$O$_4$ SINGLE CRYSTAL AND SYNTHESIS THEREOF

[75] Inventors: Hideo Kimura; Takenori Numazawa; Mitsunori Sato, all of Ibraki, Japan

[73] Assignee: National Research Institute for Metals, Japan

[21] Appl. No.: 759,775

[22] Filed: Dec. 3, 1996

[51] Int. Cl.$^6$ .................................................. C01B 35/10
[52] U.S. Cl. .............................. 423/277; 117/36; 423/285
[58] Field of Search .............................. 117/1, 3, 13, 36, 117/904; 423/277, 285

[56] References Cited

U.S. PATENT DOCUMENTS 5,343,827  9/1994  Bordu et al. ............................... 117/28

OTHER PUBLICATIONS

"Metastable Crystal Growth of the Low Temperature Phase of Barium Metaborate From the Melt", Kôzuki, et al, *J. of Cryst. Growth* 114(1991), pp. 683–686, 1991.

"Thermal Expansion of the Low Temperature Form of $BaB_2O_4$", Guig, et al *J. Am. Ceram. Soc.*, 73 [8]. pp. 2526–2527 (1990).

"B–$BaB_2O_4$ Single Crystal Growth by Czochralski Method II", Kouta, et al.; *J. of Crystal Growth* 114: pp. 676–682, 1991.

"Flux Growth of Large Single Crystals of Low Temperature Phase Barium Metaborate"; Aidong, et al.; *J. of Crystal Growth;* 74 (1986), pp. 963–969.

*Primary Examiner*—Felisa Garrett
*Attorney, Agent, or Firm*—Wenderoth, Lind & Ponack

[57] ABSTRACT

A low-temperature phase oxide single crystal having a nominal composition of Ba($B_{1-x}M_x$)$_2$O$_4$ is synthesized by partially substituting B of $BaB_2O_4$ with one or more additive elements M and by growing the single crystal in a Ba($B_{1-x}M_x$)$_2$O$_4$ composition compound (where M is one or more additive elements selected from the group consisting of Al, Ga and In, and $0.001 < x < 0.15$).

2 Claims, 3 Drawing Sheets

BA(B$_{1-x}$ M$_x$)$_2$O$_4$ SINGLE CRYSTAL AND SYNTHESIS THEREOF

FIELD OF THE INVENTION

This invention relates to a Ba(B$_{1-x}$M$_x$)$_2$O$_4$ single crystal and a synthesizing method thereof. More particularly, this invention relates to a new oxide single crystal having a nominal composition of Ba(B$_{1-x}$M$_x$)$_2$O$_4$ and a method of synthesizing the same that is excellent in a nonlinear optical property and is applicable to laser elements or wave changing elements.

DISCLOSURE OF THE PRIOR ART

Low-temperature phase BaB$_2$O$_4$ single crystals have been conventionally synthesized as a metastable phase from a melt having a stoichiometric composition of BaB$_2$O$_4$ within a temperature range which is more than a phase transition temperature (925° C.) in an equilibrium diagram and is less than a melting point (1100° C.). The reproducibility of the single crystals in this manner is not sufficient because these single crystals are metastable-grown, so that the quality of them is unstable and differs for every rod produced.

In order to solve this problem, fluxes such as Na$_2$O have been added to the melt of the stoichiometric composition. These fluxes allow low-temperature phase BaB$_2$O$_4$ single crystals to be a stable phase by decreasing the melting point. In this manner, however, a mixture consisting of the low-temperature phase BaB$_2$O$_4$ compound and fluxes as an impurity is formed, resulting in deterioration of the quality of the BaB$_2$O$_4$ single crystals.

This invention has an object to provide a new Ba—B system oxide single crystal having an excellent nonlinear optical property. Another object of the invention is to provide a synthesizing manner to produce a highly pure Ba—B system oxide single crystal with good reproducibility.

These and other objects, features and advantages will be more apparent by reading the following specification and accompanying drawings.

DETAILED DESCRIPTION OF THE INVENTION

Figure 1:
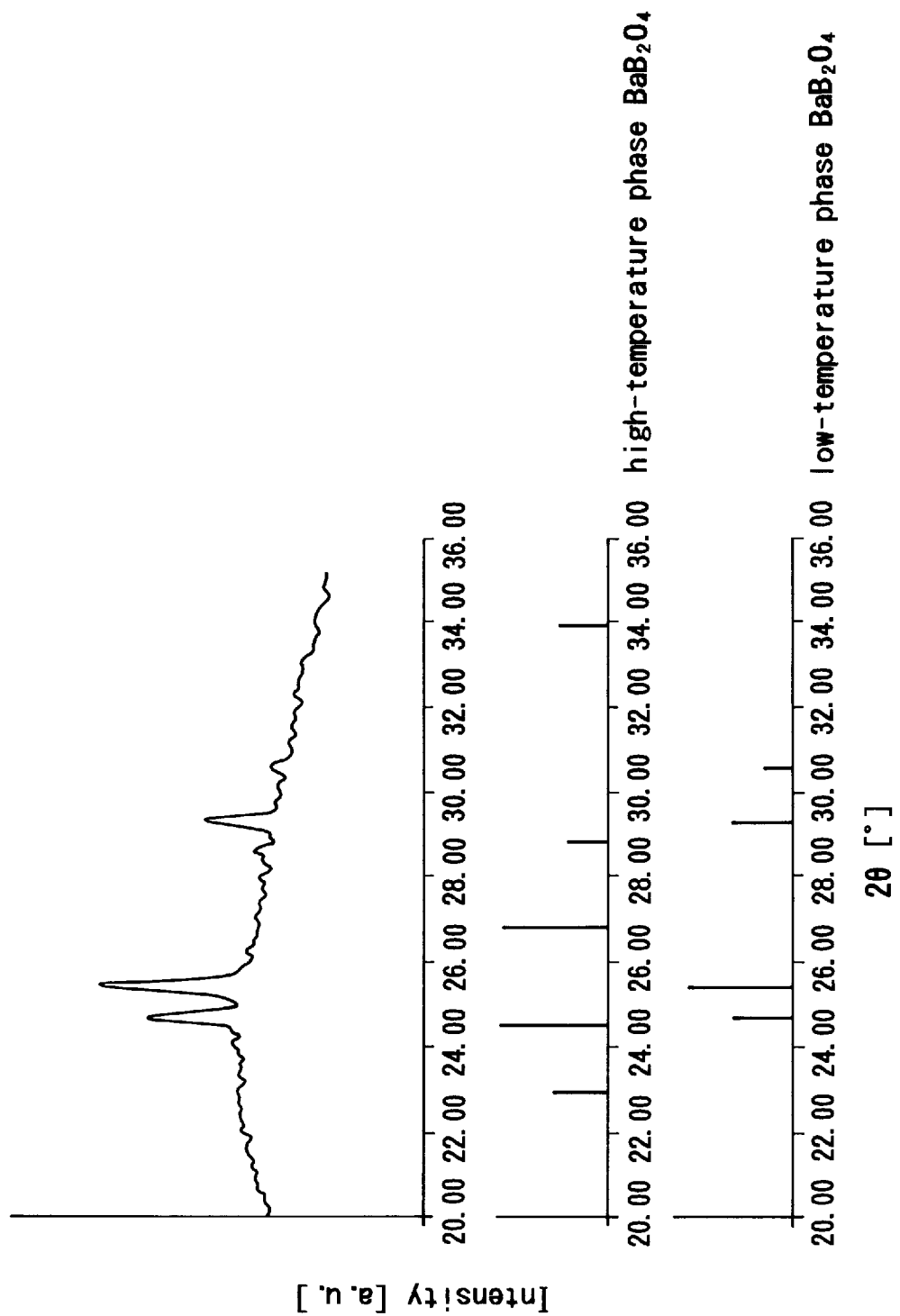
FIG. 1 depicts X-ray diffraction diagrams of a low-temperature phase Ba(B$_{0.95}$Al$_{0.05}$)$_2$O$_4$ single crystal and the conventional pure high- and low-temperature phase BaB$_2$O$_4$ compounds.

This invention provides an oxide single crystal having a nominal composition of Ba(B$_{1-x}$M$_x$)$_2$O$_4$ (where M is one or more additive element selected from the group consisting of Al, Ga and In, and x is an atomic ratio within a range of from 0.001 to 0.15), consisting essentially of a low-temperature phase compound.

This invention also provides a method of synthesizing a low-temperature phase oxide single crystal having a nominal composition of Ba(B$_{1-x}$M$_x$)$_2$O$_4$, comprising the steps of partially substituting B of BaB$_2$O$_4$ with one or more additive elements M selected from the group consisting of Al, Ga and In by adding said additive element(s) M to a compound having a nominal composition of BaB$_2$O$_4$ within an atomic ratio x range of from 0.001 to 0.15, and growing said oxide single crystal in a melt of a Ba(B$_{1-x}$M$_x$)$_2$O$_4$ composition compound at a temperature range of under a transition temperature of a low-temperature phase BaB$_2$O$_4$ compound.

According to this invention, low-temperature Ba(B$_{1-x}$M$_x$)$_2$O$_4$ single crystals with good quality are synthesized as a stable phase with good reproducibility. These single crystals would be substitutes for the conventional BaB$_2$O$_4$ single crystals because they have the same excellence in nonlinear optical properties as the conventional single crystals have. The single crystals of this invention may be applicable to a wide range of technological fields where laser elements or wave changing elements are employed.

EMBODIMENTS

The oxide single crystal of this invention has a nominal composition expressed by Ba(B$_{1-x}$M$_x$)$_2$O$_4$. The M in the nominal composition is one or more additive element selected from the group consisting of Al, Ga and In. The x is an atomic ratio of from 0.001 to 0.15. Since each of these three elements, Al, Ga and In, as well as B belongs to the 3B family in the periodical table, it does not behave like impurities in the Ba(B$_{1-x}$M$_x$)$_2$O$_4$ composition compound. The oxide single crystal shows an excellent nonlinear optical property as same as the conventional BaB$_2$O$_4$ compound does.

The oxide single crystal consists essentially of a low-temperature phase, and this is produced by substituting B of BaB$_2$O$_4$ with one or more additive element selected from the group consisting of Al, Ga and In.

More specifically, B of BaB$_2$O$_4$ is partially replaced within the atomic ratio range of 0.001<x<0.15 by adding such additive element(s) to a BaB$_2$O$_4$ compound. Those elements are homologous with boron and promote production of a low-temperature phase. A stable low-temperature phase single crystal grows from the Ba(B$_{1-x}$M$_x$)$_2$O$_4$ composition compound by using a a single crystal growth furnace, for example, a high-frequency heating pulling furnace or a halogen lamp heating floating zone furnace.

As mentioned in the above, since additive elements of Al, Ga and In are homologous with boron that is an objective element for replacement, they do not behave like impurities in the Ba(B$_{1-x}$M$_x$)$_2$O$_4$ composition compound and a Ba(B$_{1-x}$M$_x$)$_2$O$_4$ single crystal is synthesized with good quality. Furthermore, since a crystallization temperature decreases under the phase transition temperature (925° C.) according to the promoting effect on the low-temperature phase, the low-temperature phase which has been conventionally synthesized as a metastable phase is synthesized as a stable one. A stable low-temperature phase is produced with good reproducibility.

Now, some examples will be shown to explain this invention more in detail. Needless to say, the invention is not restricted the following examples.

EXAMPLES

Example 1

Oxide single crystals having a nominal composition expressed by Ba(B$_{1-x}$M$_x$)$_2$O$_4$ were synthesized using a high-frequency heating pulling furnace.

Each of Al, Ga and In as a low-temperature phase promoting element was added to a BaB$_2$O$_4$ compound having a stoichiometric composition. Ba(B$_{0.95}$Al$_{0.05}$)$_2$O$_4$, $Ba(B_{0.95}Ga_{0.05})_2O_4$ and $Ba(B_{0.95}In_{0.05})_2O_4$ composition compounds with the atomic ratio x of 0.05 in the $Ba(B_{1-x}M_x)_2O_4$ composition were produced by partially substituting B of the $BaB_2O_4$ with each of Al, Ga and In. Each composition compound with the amount of 50 g was melted in the air in a platinum crucible with the size of 50 mm$\phi$ and 50 mm height, which was installed in the high-frequency heating pulling furnace. Melting points of these composition compounds were 1098° C., 1097° C. and 1096° C., respectively. A seed crystal with the size of 2 mm$\phi$ and 50 mm length was dipped down into the each melt, while the seed crystal was rotated at the rate of 20 rpm. After 30 minutes, the seed crystal which was kept rotating at the same rate was pulled up from the each melt at the pulling rate of 5 mm/h. This pulling process was continued for 12 hours.

Then, a low-temperature phase $Ba(B_{1-x}M_x)_2O_4$ single crystals having a straight body sized 20 mm$\phi$ and 40 mm length was produced on the tip of the seed crystal. Every single crystal grew at a temperature range of from 880° C. to 900° C., which was under the phase transition temperature of a pure $BaB_2O_4$ compound, and it had little crystalline defect. The $Ba(B_{0.95}Al_{0.05})_2O_4$ composition compound had the lowest crystallization temperature among these three composition compounds. This shows that Al has a great promoting effect on the low-temperature phase.

Figure 2:
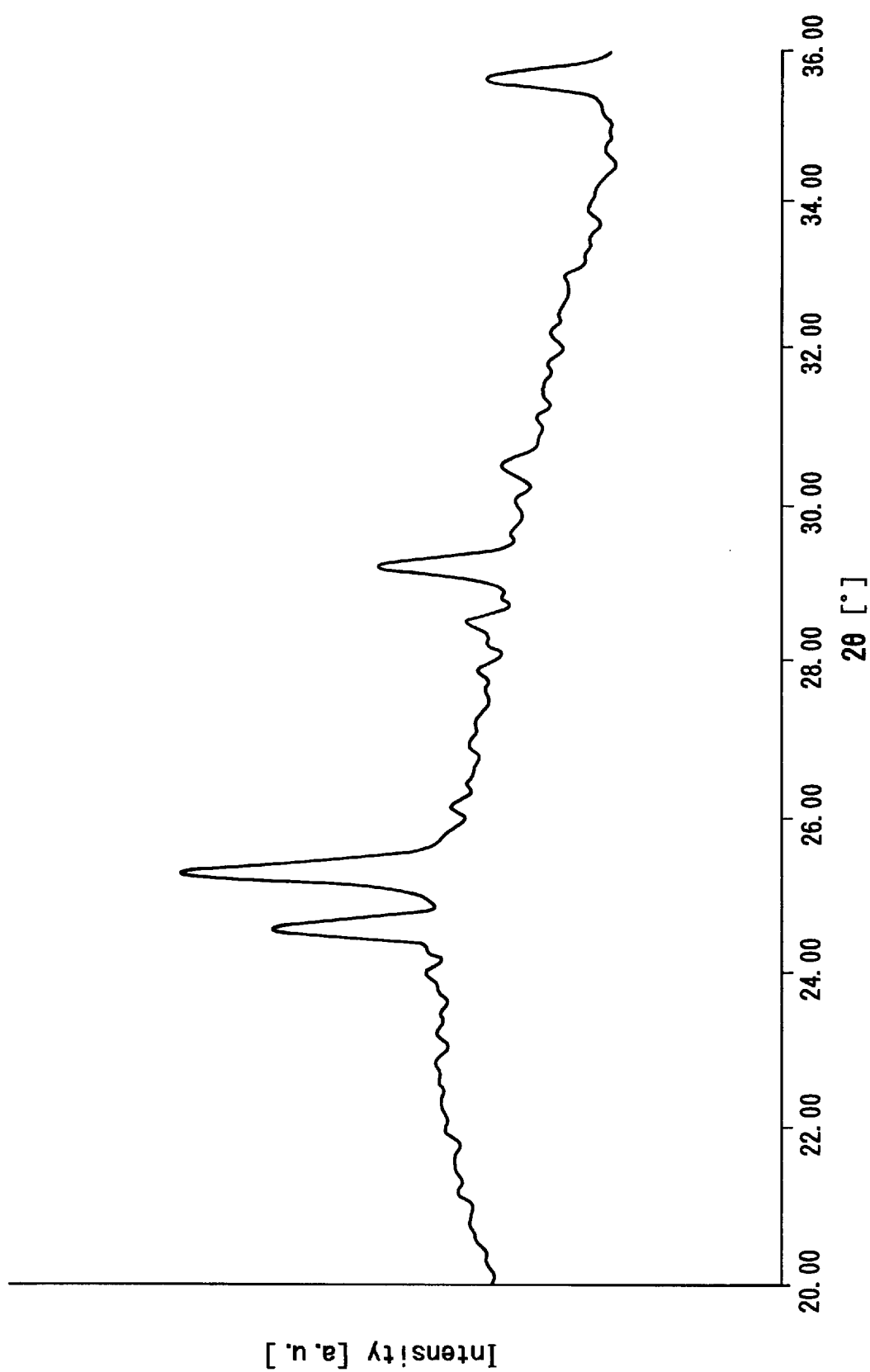
FIG. 2 depicts a magnified X-ray diffraction diagram of the Ba(B$_{0.95}$Al$_{0.05}$)$_2$O$_4$ single crystal.

The low-temperature phase $Ba(B_{0.95}M_{0.05})_2O_4$ single crystal thus-produced were pulverized and an X-ray diffraction analysis was carried out using the powders. It was confirmed from the results of the x-ray diffraction analysis shown in FIGS. 1 and 2 that the low-temperature phase $Ba(B_{0.95}M_{0.05})_2O_4$ single crystals produced correspond to the pure low-temperature phase $BaB_2O_4$ compound.

It was also confirmed that highly pure low-temperature phase $Ba(B_{0.95}M_{0.05})_2O_4$ single crystals, which have little crystalline defect and are similar to the pure low-temperature phase $BaB_2O_4$ compound, are synthesized as a stable phase by the addition of Al, Ga and In, each of which is one of the low-temperature phase promoting elements.

Example 2

Oxide single crystals having a nominal composition expressed by $Ba(B_{1-x}M_x)_2O_4$ were synthesized using a high-frequency heating pulling furnace.

Each mixture of two elements selected from the group consisting of Al, Ga and In, in which an atomic ratio of the two elements was 1:1, was added to a $BaB_2O_4$ compound having a stoichiometric composition so that a total atomic ratio of the two elements would be x=0.05 in the $Ba(B_{1-x}M_x)_2O_4$ composition. $Ba(B_{0.95}M_{0.05})_2O_4$ composition compounds were produced by partially substituting B of $BaB_2O_4$ with a combination of the two elements. Each of the composition compounds with the amount of 50 g was melted in the air in a platinum crucible with the size of 50 mm$\phi$ and 50 mm height, which was installed in the high-frequency heating pulling furnace. Melting points distributed in a temperature range of from 1095° C. to 1098° C. A seed crystal with the size of 2 mm$\phi$ and 50 mm length was dipped down into the each melt, while the seed crystal was rotated at the rate of 20 rpm. After 30 minutes, the seed crystal which was kept rotating at the same rate was pulled up from the each melt at the pulling rate of 5 mm/h. This pulling process was continued for 12 hours.

Then, a low-temperature phase $Ba(B_{0.95}M_{0.05})_2O_4$ single crystal having a straight body sized 20 mm$\phi$ and 40 mm length was produced on the tip of the seed crystal. The single crystal grew at a temperature range of from 850° C. to 900° C., which was under the phase transition temperature of the pure $BaB_2O_4$ compound, and it had little crystalline defect. Every combination of the two elements selected from the group consisting of Al, Ga and In shows the same low-temperature promoting effect as a single element (Example 1) does.

It was confirmed that highly pure low-temperature phase $Ba(B_{0.95}M_{0.05})_2O_4$ single crystals, which have little crystalline defect, are synthesized as a stable phase by the addition of a mixture of two elements selected from the group consisting of Al, Ga and In, each of which is one of the low-temperature phase promoting elements.

Example 3

Oxide single crystals having a nominal composition expressed by $Ba(B_{1-x}M_x)_2O_4$ were synthesized using a halogen lamp heating floating zone furnace.

As in the same manner of Examples 1 and 2, low-temperature phase $Ba(B_{1-x}M_x)_2O_4$ single crystals were synthesized by adding each mixture of more than two elements selected from the group consisting of Al, Ga and In as well as a single element thereof to a $BaB_2O_4$ compound before melting the $BaB_2O_4$ compound. In this case, highly pure low-temperature phase $Ba(B_{0.95}M_{0.05})_2O_4$ single crystals, which have few crystalline defects, were also synthesized as a stable phase.

Furthermore, low-temperature phase $Ba(B_{1-x}M_x)_2O_4$ single crystals were synthesized by adding each mixture of more than two elements selected from the group consisting of Al, Ga and In as well as a single element thereof to a $BaB_2O_4$ compound after melting a $BaB_2O_4$ compound.

Example 4

Oxide single crystals having a nominal composition expressed by $Ba(B_{1-x}Al_x)_2O_4$ were synthesized by changing a value of the atomic ratio x in the $Ba(B_{1-x}Al_x)_2O_4$ composition.

Small amounts of Al was added to a $BaB_2O_4$ compound having a stoichiometric composition so that atomic ratios x of Al in the $Ba(B_{1-x}Al_x)_2O_4$ composition would be 0.001, 0.01, 0.1 and 0.15, respectively. These composition compounds were $Ba(B_{0.999}Al_{0.001})_2O_4$, $Ba(B_{0.99}Al_{0.01})_2O_4$, $Ba(B_{0.9}Al_{0.01})_2O_4$ and $Ba(B_{0.85}Al_{0.15})_2O_4$. Each composition with the amount of 50 g was melted in the air in a platinum crucible with the size of 50 mm$\phi$ and 50 mm height, which was installed in the high-frequency heating pulling furnace. Melting points of these compositions distributed in a temperature range of from 1090° C. to 1098° C. A seed crystal with the size of 2 mm$\phi$ and 50 mm length was dipped down into the each melt, while the seed crystal was rotated at the rate of 20 rpm. After 30 minutes, the seed crystal which was kept rotating at the same rate was pulled up from the each melt at the pulling rate of 5 mm/h. This pulling process was continued for 12 hours.

Figure 3:
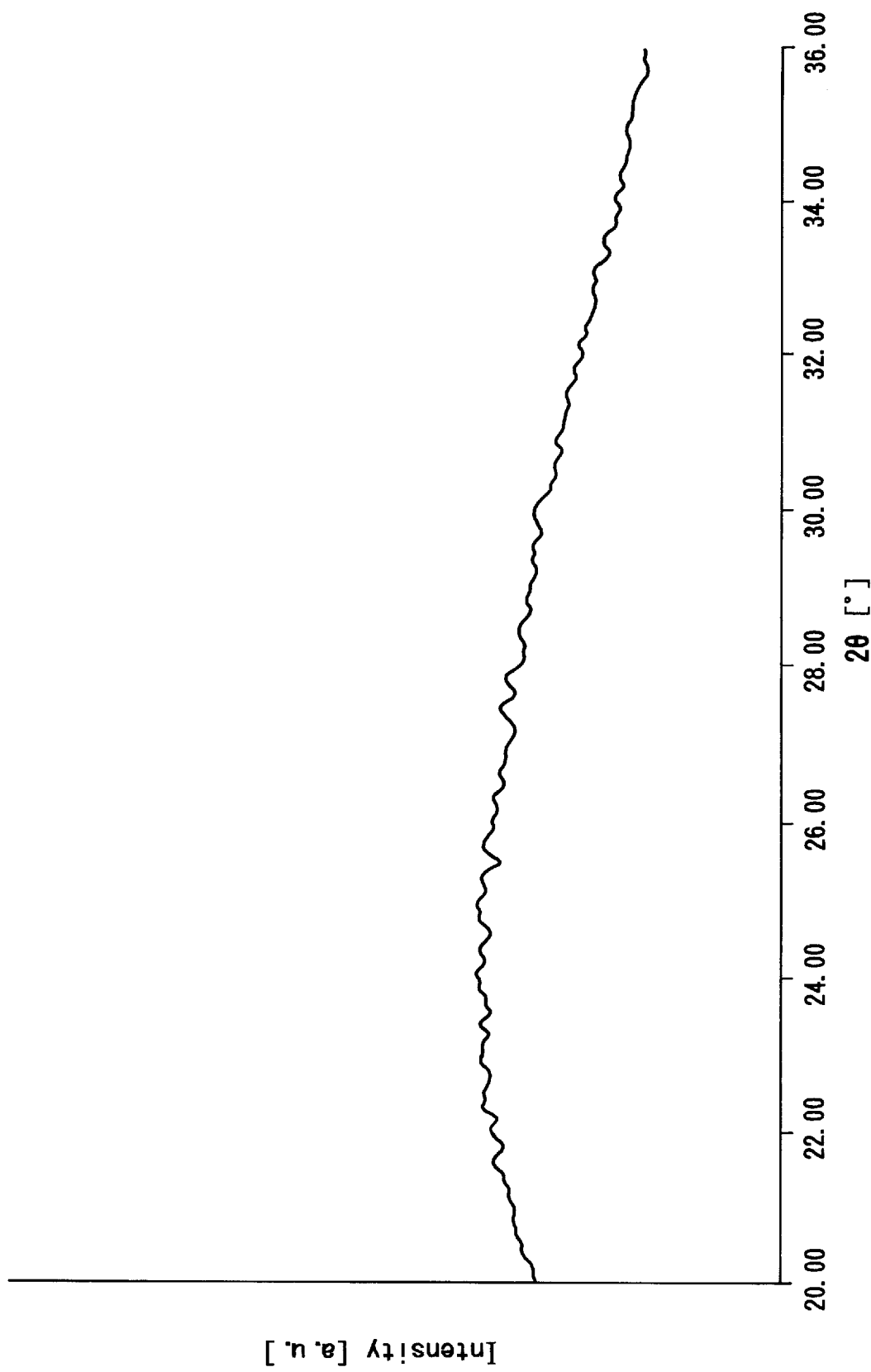
FIG. 3 depicts an X-ray diffraction diagram of a Ba(B$_{0.85}$Al$_{0.15}$)$_2$O$_4$ compound.

Then, four solid materials having a straight body sized 20 mm$\phi$ and 40 mm were produced on the tip of the seed crystal. Each of three solids with the atomic ratio of x=0.001, 0.01 and 0.1 was confirmed to be a low-temperature phase $Ba(B_{1-x}Al_x)_2O_4$ single crystal. The rest one whose atomic ratio x is 0.15 was not a single crystal. As is seen from the data disclosed in FIG. 3, there is no peak showing crystalline properties in the latter solid sample. This sample is not composed of a crystal, but of a glass.

On the other hand, no low-temperature phase promoting effect was confirmed on the solid sample whose atomic ratio x is 0.001 because a crystallization temperature of this sample was 1030° C., which is over the transition temperature (925° C.) of the low-temperature phase compound. The solid samples with the atomic ratio of x=0.01 and x=0.1 were highly pure low-temperature $Ba(B_{1-x}Al_x)_2O_4$ single crystals, which were a stable phase and had few crystalline defects.

It was confirmed that stable low-temperature phase $Ba(B_{1-x}M_x)_2O_4$ single crystals with good quality are synthesized by adjusting an atomic ratio x of additive elements to be $0.001<x<0.15$.

What is claimed is:

1. An oxide single crystal having a nominal composition of $Ba(B_{1-x}M_x)_2O_4$ where M is one or more of the additive elements selected from the group consisting of Al, Ga and In, and x is an atomic ratio within a range of from 0.001 to 0.15, and said oxide single crystal consisting essentially of a low-temperature phase compound.

2. A method of synthesizing a low-temperature phase oxide single crystal having a nominal composition of $Ba(B_{1-x}M_x)_2O_4$, comprising the steps of partially substituting B of $BaB_2O_4$ with one or more additive element M selected from the group consisting of Al, Ga and In by:

a) adding said additive element(s) M to a compound having a nominal composition of $Ba(B_{1-x}M_x)_2O_4$, within an atomic ratio x in the range of from 0.001 to 0.15, and b) growing said oxide single crystal in a melt of a $Ba(B_{1-x}M_x)_2O_4$ composition compound at a temperature range of under a transition temperature of a low-temperature phase $BaB_2O_4$ compound.

* * * * *